United States Patent
Romero

(10) Patent No.: US 8,260,943 B2
(45) Date of Patent: Sep. 4, 2012

(54) APPLYING A TRANSFER FUNCTION TO A SIGNAL FOR DETERMINING COMPLIANCE TO A SPECIFICATION

(75) Inventor: Gabriel Leandro Romero, Colorado Springs, CO (US)

(73) Assignee: LSI Corporation, Milpitas, CA (US)

( * ) Notice: Subject to any disclaimer, the term of this patent is extended or adjusted under 35 U.S.C. 154(b) by 1039 days.

(21) Appl. No.: 11/323,595

(22) Filed: Dec. 29, 2005

(65) Prior Publication Data

US 2007/0156914 A1    Jul. 5, 2007

(51) Int. Cl.
*G06F 15/16*    (2006.01)

(52) U.S. Cl. .................. 709/230; 455/91; 455/115.1

(58) Field of Classification Search .......... 709/230; 702/109; 330/149; 455/91, 115.1, 126
See application file for complete search history.

(56) References Cited

U.S. PATENT DOCUMENTS

| | | | | |
|---|---|---|---|---|
| 4,713,782 A * | 12/1987 | Blackham | ..... | 702/109 |
| 5,602,765 A * | 2/1997 | Tanaka et al. | ..... | 708/322 |
| 6,038,518 A * | 3/2000 | Farwell | ..... | 702/89 |
| 6,571,202 B1 * | 5/2003 | Loman et al. | ..... | 703/2 |
| 6,662,130 B1 * | 12/2003 | Peel et al. | ..... | 702/104 |
| 6,718,288 B1 * | 4/2004 | Wakeman | ..... | 703/2 |
| 6,804,615 B2 * | 10/2004 | Hyde | ..... | 702/56 |
| 6,813,589 B2 * | 11/2004 | Li et al. | ..... | 702/191 |
| 6,917,906 B2 * | 7/2005 | Franke | ..... | 703/2 |
| 7,299,146 B2 * | 11/2007 | Chliwnyj | ..... | 702/106 |
| 2004/0168107 A1 * | 8/2004 | Sharp et al. | ..... | 714/33 |
| 2004/0203458 A1 * | 10/2004 | Nigra | ..... | 455/67.13 |
| 2005/0134995 A1 * | 6/2005 | Chliwnyj | ..... | 360/77.12 |
| 2005/0275395 A1 * | 12/2005 | Yoshihara et al. | ..... | 324/76.12 |
| 2006/0038709 A1 * | 2/2006 | Lu et al. | ..... | 341/143 |
| 2007/0109047 A1 * | 5/2007 | Benedict et al. | ..... | 330/149 |
| 2007/0250186 A1 * | 10/2007 | Higuchi et al. | ..... | 700/37 |

FOREIGN PATENT DOCUMENTS

WO    WO 9905498 A1 *   2/1999

OTHER PUBLICATIONS

Transfer function estimation using elemental sets Stoica, P.; Sundin, T.;Signal Processing Letters, IEEE vol. 6, Issue 10, Oct. 1999 pp. 269-272 Digital Object Identifier 10.1109/97.789607.*

* cited by examiner

*Primary Examiner* — Asad Nawaz
*Assistant Examiner* — Najeebuddin Ansari
(74) *Attorney, Agent, or Firm* — Christopher P. Whitham; Cochran Freund & Young LLC

(57) ABSTRACT

An apparatus and a method for implementing transmitter compliance transfer functions in software are disclosed. As per the present invention, a transfer function model is provided to modify the real time signal received from a device, such as a transmitter, to be analyzed. The real-time signal is modified according to a relative s-parameter(s) or transfer function, and is provided to a display device, such as an oscilloscope, in order to analyze the modified signal. In one embodiment, the invention may be software integrated within an oscilloscope or in a computer system.

23 Claims, 5 Drawing Sheets

APPLYING A TRANSFER FUNCTION TO A SIGNAL FOR DETERMINING COMPLIANCE TO A SPECIFICATION

BACKGROUND

A. Technical Field

The present invention relates generally to signal analysis, and more particularly, to the application of one or more compliance transfer functions to a real-time signal.

B. Background of the Invention

A communication system comprises a transmitter, a channel or a medium for transferring a signal, and a receiver. The signal-transferring medium may be a metallic cable or fiber, free space in a wireless system or a backplane printed circuit board ("PCB"). The operation of these various communication systems, and components therein, may function according to specifications that may be defined by protocols, standards, etc. For example, the performance and operation of a transmitter may be defined to deliver a "zero-link" signal that meets certain specification parameters. Furthermore, other protocol specifications may define signal quality characteristics not at the output of a transmitter, but rather at a receiver.

The characteristics of a signal at a receiver may depend on the performance of the transmitter and the communications medium on which the signal is communicated to the receiver. In an attempt to develop a standard for interoperability comities, protocols and standards define specifications related to the signal quality at the receiver, as opposed to the specifying the transmitters characteristic. In order for this to be an effective standard or protocol, the characteristics of the communications medium or the load should be specified. During the transmission of the signal from the transmitter to the receiver, the signal characteristics may change as it travels on the communications medium. This change in signal characteristics may be measured or modeled, with varying effectiveness, by testing the transmission of the signal on a particular medium or modeling the transmission of the signal using simulation applications, such as Spice™.

Methods of analyzing the characteristics of a signal may be explained with reference to FIG. 1. The device or transmitter 101 to be analyzed transmits an electrical signal 104 onto a communications medium to a receiver. These signals 104 may be simulated by simulation applications 102, such as Spice™, or may be analyzed by physically transmitting the electrical signal on a communications medium 103, such as sample cables, attenuators or backplane.

In the first method, a Spice simulator 102 is used to make a spice model of the device 101. The simulator 102 attempts to model the transmission of an electrical signal on a communications medium. However, the simulator 102 oftentimes is unable to completely model and completely account for changes to a signal as it is generated and transmitted from a transmitter to a receiver device.

A Spice model generally considers the ideal conditions and environment of the device or system whereas the real model may have some type of error producing factors, which need to be considered as well. These error-producing factors may lie in the channel such as a co-axial cable that might have some variations in its construction caused by different manufacturing processes by different vendors. Further, the dielectric materials in insulators that are put in between different co-axial Cables may also vary. Further yet, backplane variations may be present across different vendor backplanes. Accordingly, a spice modulator is oftentimes unable to account for these different variations between vendor communications mediums and not accurately simulate a signal at a receiver within a particular system.

In the second method of analyzing an electrical signal, various cables, attenuators, sample backplanes or other physical communications mediums are built 103. These sample communications medium may be used by engineers in building the match cables, or a suitable load. The engineers may require the use of a network analyzer to extract S parameters from a cable or backplane. Various problems exist with this second method including additional cost associated with the construction and maintenance of physical communications mediums, and the network analyzer. Additionally, there may be mismatches between a test load and a communications medium that is actually employed within a system.

The inability to accurately test a load, including the corresponding communications medium, often gives rise to disagreements between a supplier and customer regarding the protocol specification compliance of a component within a particular system. Thus, in an attempt to develop a standard for interoperability comities it is essential to specify and accurately test the signal quality at a receiver prior to insertion within a system.

SUMMARY OF THE INVENTION

The present invention provides an apparatus and a method for implementing one or more protocol compliant transfer functions in software that enables a user to predict signal quality at a receiver. In one embodiment of the present invention, a software-implemented transfer function is provided to modify a real-time signal received from a transmitting device, such as a transmitter, so that the modified real-time signal may be used to predict signal quality at a receiver. For example, the real-time signal from a Device under Test ("DUT") may be captured and preserved. The data representing this signal can then be copied and this copy post-processed (with the transfer function or S-parameter model) creating a new representation of the original signal. This new representation now represents what the original signal would look like if it has passed through a medium that met the requirements of the transfer function relating to a particular protocol specification. The modified representation of the signal and the original captured signal may then be displayed and/or otherwise analyzed by various devices including an oscilloscope.

The modified signal may be analyzed relative to a certain standard or protocol to identify whether a corresponding signal at a receiver would fall within particular specifications. Real-time signals are received from a transmitting device and data representing these waveforms is stored and subsequently modified according to a transfer function implemented in software. The characteristics of the transfer function may be defined by a protocol or standard specification describing communications media to determine whether a transmitter is able to deliver a compliant signal at a receiver within a compliant system.

In one embodiment of the signal, a device control is provided that adjusts the transmitting device, DUT or test equipment relative to the signal modified by the transfer function. For example, a modified signal from a transmitter may be fed back to the device control so that the transmitter settings may be adjusted to improve the quality of the signal that will be received at a receiver. This process may be iteratively-performed multiple times to optimize the transmitter or other device relative to the compliant system in which it will be integrated.

As per various embodiments of the invention, the transfer function is implemented by using a software or firmware module (transfer function module). A signal modification module is used for modifying the captured real-time signal relative to one or more transfer functions within the transfer function module. The invention further employs a signal analysis module so that the modified signal may be used for adjusting the transmitting device or other device settings.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

An apparatus and a method for implementing transmitter compliance transfer functions in software or firmware are disclosed. In one embodiment of the invention, a transfer function is provided to modify a captured real-time signal received from a transmitting device, such as a transmitter, to be analyzed relative to one or more protocol specifications. The captured real-time signal is modified according to a relative s-parameter(s) or transfer function, and is provided to a display device, such as an oscilloscope, in order to analyze the modified signal. Thereafter, both the captured real-time signal and the modified signal may be displayed to a user. The invention may be software integrated within an oscilloscope or in a computer system.

The following description is set forth for purpose of explanation in order to provide an understanding of the invention. However, it is apparent that one skilled in the art will recognize that embodiments of the present invention, some of which are described below, may be incorporated into a number of different computing systems and devices. The embodiments of the present invention may be present in software or firmware. Structures and devices shown below in block diagram are illustrative of exemplary embodiments of the invention and are meant to avoid obscuring the invention. Furthermore, connections between components within the figures are not intended to be limited to direct connections. Rather, data between these components may be modified, re-formatted or otherwise changed by intermediary components.

Reference in the specification to "one embodiment", "in one embodiment" or "an embodiment" etc. means that a particular feature, structure, characteristic, or function described in connection with the embodiment is included in at least one embodiment of the invention. The appearances of the phrase "in one embodiment" in various places in the specification are not necessarily all referring to the same embodiment.

A. Overview

Figure 1:
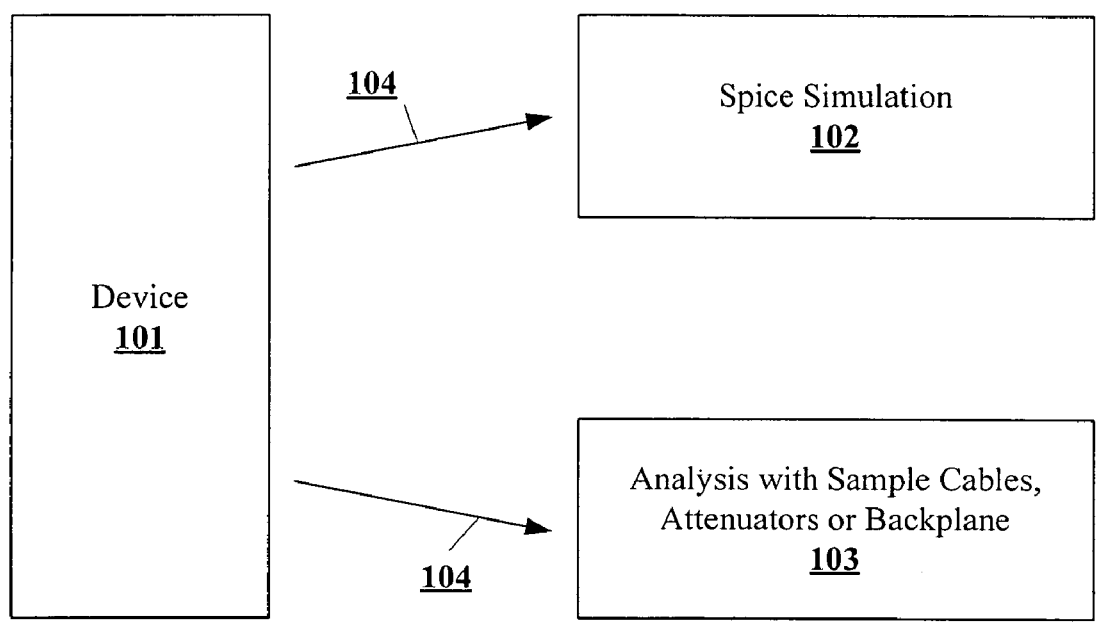
FIG. 1 illustrates various testing methods used in the prior art to analyze the electrical signal output of an electronic device.
Figure 2:
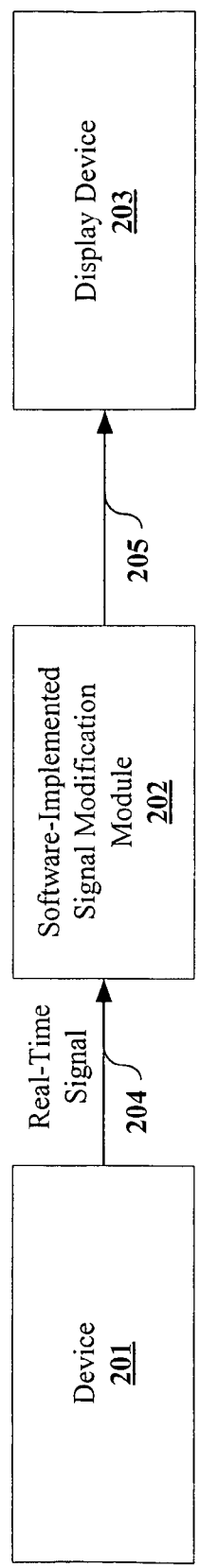
FIG. 2 illustrates a general block diagram of one embodiment of the present invention.

FIG. 2 illustrates a system in which a signal at a receiver within a system may be predicted and analyzed using a software-implemented transfer function according to one embodiment of the invention. A transmitting device 201, such as a transmitter, outputs a real-time signal 204 that is captured and stored, and thereafter provided to a software-implemented signal modification module 202. In one embodiment, the software-implemented signal modification module 202 modifies the real-time signal 204 relative to a transfer function or s-parameter. The modified signal 205 is then outputted to a display device 203, such as an oscilloscope or computer display screen, for analysis and/or monitoring of the signal 204. In addition, the captured real-time signal 202 may also be displayed with the modified signal 204. In one embodiment, the software-implemented signal modification module 202 is integrated within an oscilloscope. In another embodiment, the software-implemented signal modification module 202 is integrated within a computer system.

The characteristics of the real-time signal 204 may be mathematically modified according to a transfer function or s-parameter within the software-implemented signal modification module 202. This transfer function may be derived from various sources including a protocol specification that describes the transmission properties of a compliant communications medium. A transfer function is a mathematical representation of the relation between the input and output of a linear time-invariant system. Generally, the transfer function is a piece-wise function, for example in terms of the $|S_{21}|$ parameters.

The transfer function in a communication system may be defined as a load function often called a Transmitter Compliance Transfer Function ("TCTF"), which includes specifications describing both the transmitter characteristics and signal quality at receiver. These specifications may include minimum receiver-side EYE requirements of the signal.

The display device 203 shown in FIG. 2 may be a high-end digital sampling oscilloscope used to capture the real-time signal 204. The real-time signal 204 is then altered by an integrated software-implemented signal modification module 202 according to a transfer function and displayed. The software-implemented signal modification module 202 may allow a user to manually enter a particular transfer function(s) or select one or more transfer functions from a menu. Because many specifications require the transmitter to meet the EYE requirements before and after the transmitter compliance transfer function, the invention may provide a feature of protecting the original transmitted signal data from alteration. Hence, both the actual transmitted signal 204 and the modified signal 205 after the transfer function can be displayed simultaneously with the appropriate EYE masks overlaid.

Further, data captured at one location may be transferred for analysis to another location or customer site. In addition, one data set can be compared to multiple standards thereby allowing one transceiver to be quickly characterized relative to multiple protocols.

B. Signal Analysis with Feedback

Figure 3:
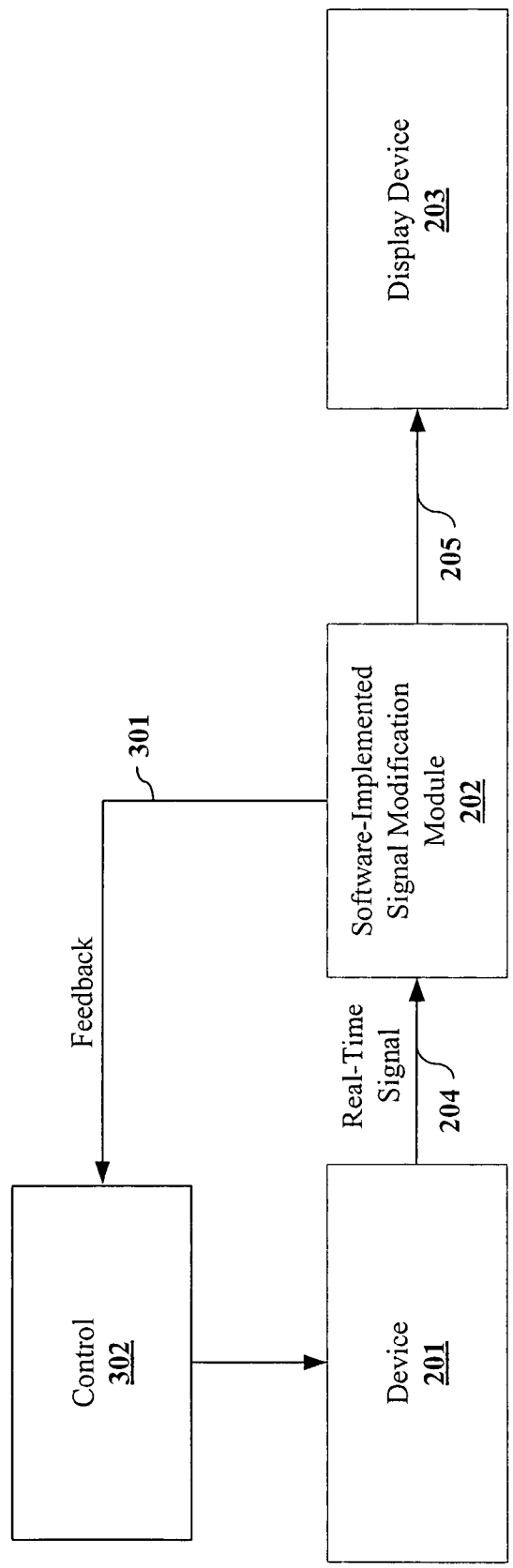
FIG. 3 illustrates a block diagram of a system having a software-implemented signal modification module and corresponding feedback control according to one embodiment of the invention.

FIG. 3 shows an embodiment of the invention that introduces feedback 301 between the software-implemented signal modification module 202 and the real-time device 201. Once the real-time signal 204 from the device 201 is captured and stored, it is modified by software-implemented signal modification module 202 according to a particular transfer function. The modified signal 205 is displayed on a display device 203, such as an oscilloscope.

Feedback 301 is provided to enable the device 201 or test equipment to be adjusted relative to the modified signal 205. A control 302 receives the feedback and allows the adjustment of the device or testing equipment characteristics. In one embodiment the feedback 301 and the control 302 may be designed to allow manual adjustments of the device 201. In particular, a user may look at the output signal at the display 203 and use the control device 302 to adjust the real-time device 201 to obtain desired output on the modified signal 205.

In another embodiment, the feedback 301 and the control 302 may be operated automatically. For example, the feedback signal 301 may be analyzed relative to a particular set of specifications. If the modified signal 205 falls outside of the specifications, then the control 302 may adjust the device 201 in order to generate a signal that would provide a compliant modified signal 205. In addition, the control 302 may refine the modified signal 205 by adjusting the device 201 to improve a predicted signal quality at a receiver within a particular system. One skilled in the art will recognize that various techniques may be used to adjust the device 201 relative to the feedback 301 and/or modified signal 205.

C. Software-Implemented Signal Modification Module

Figure 4:
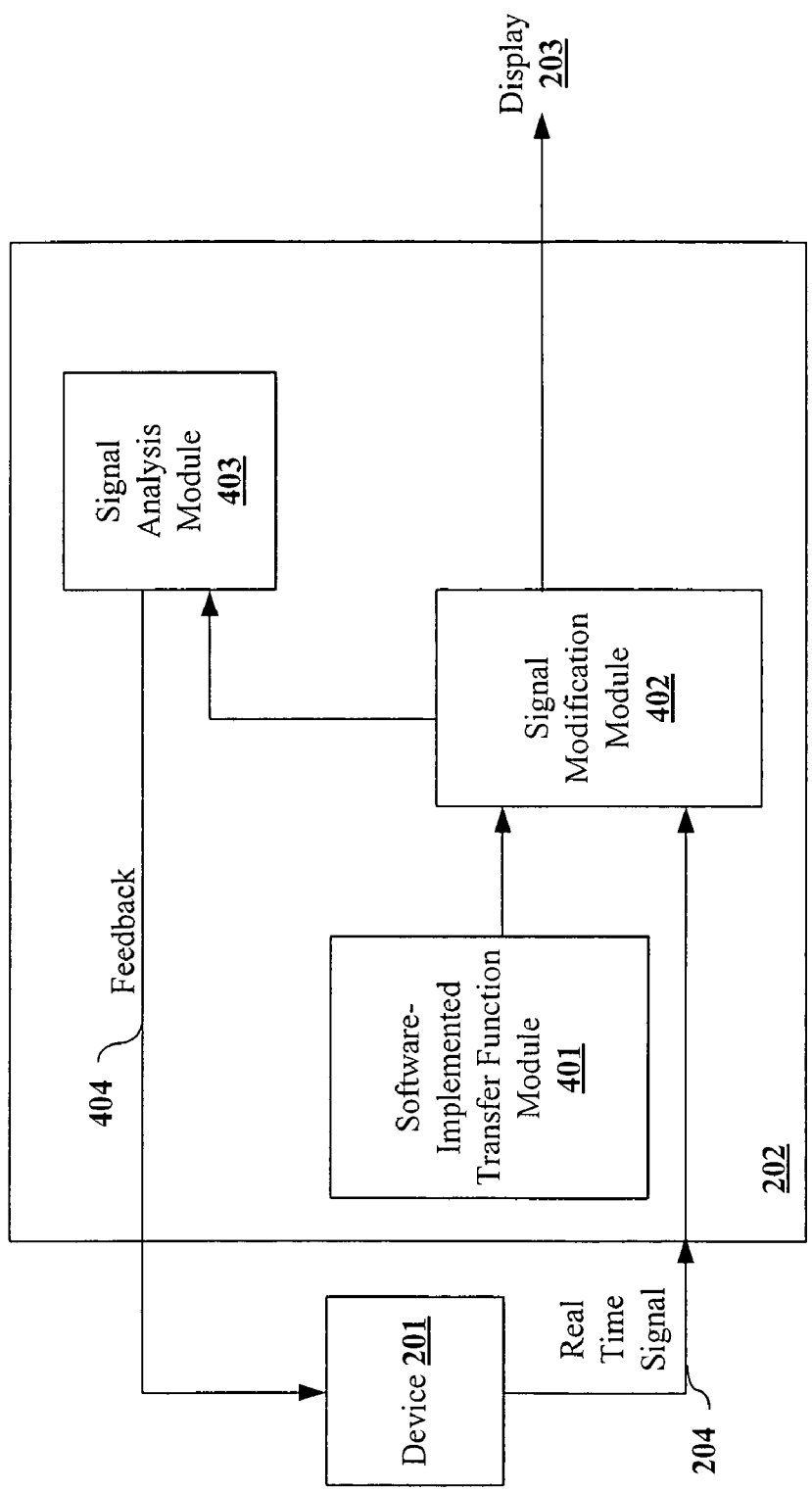
FIG. 4 illustrates a detailed block diagram of a software-implemented signal modification module according to one embodiment of the invention.

FIG. 4 illustrates a software-implemented signal modification module according to one embodiment of the invention. The software-implemented signal modification module 202 receives a captured and stored real-time signal 204 from the device 201 and applies a compliance transfer function to the signal 204. The software-implemented signal modification module 202 comprises a transfer function module 401, a signal modification module 402 and a signal analysis module 403.

The transfer function module 401 may contain memory to store the transfer function or functions associated with a standard/protocol, the device 201, or particular communications medium on which the signal may be transmitted. The transfer function module 401 is intended to provide a more accurate representation of the changes in signal characteristics as compared to simulators discussed above. The transfer function module may account for characteristics such as variations of a power supply, process variations in the packaging electrical components, differences in trace links that might occur in the package, or other such characteristics known within the art.

The signal modification module 402 modifies the captured and stored real-time signal 204 according to one or more selected transfer functions. This modification may include changes in amplitude, phase, the addition of noise or distortion, and other characteristic changes of the signal that may occur. The signal analysis module 403 receives a modified signal from the signal modifying module 402 and analyzes the modified signal. As described above, this analysis may identify whether the modified signal falls within particular specifications for a protocol or standard. Additionally, the modified signal and the captured real-time signal 204 may be simultaneously displayed. The signal analysis module 403 may adjust the transmitting device 201 by comparing the modified signal to one or more protocol specifications.

According to one embodiment of the invention, an input of the software-implemented signal modification module 202 is connected to an output of the device 201. This connection may occur via an oscilloscope probe. A signal is captured on the input, stored and made available for display. The signal is also modified by the signal modifying module 402 according to at least one transfer function stored within the software-implemented transfer function 401. This modified signal is transmitted to a display device 203, which may simultaneously display both the signal 204 from the device and the modified signal.

D. Overall Process of the Invention

Figure 5:
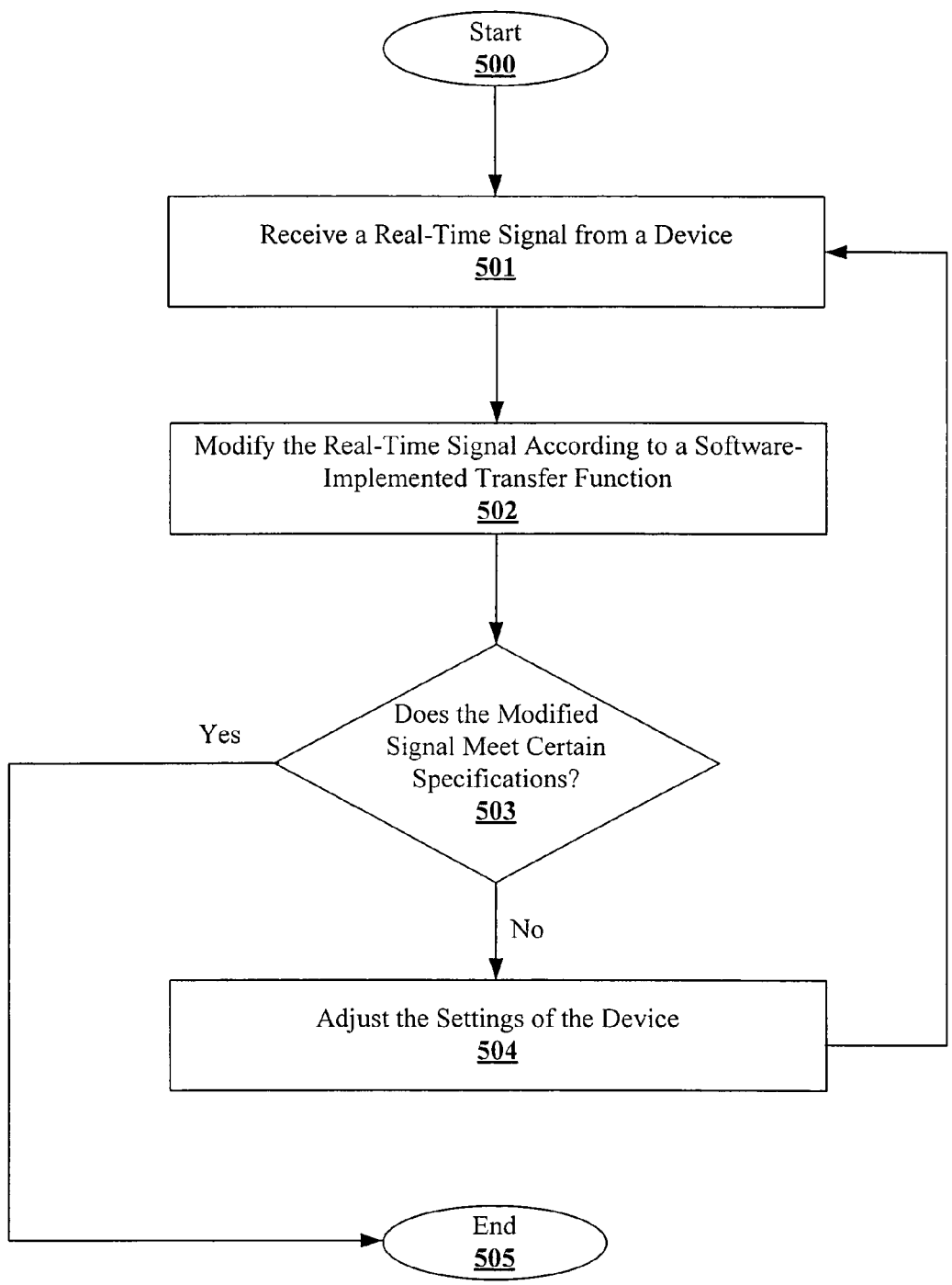
FIG. 5 is a flowchart illustrating a method of real-time analysis of a signal according to one embodiment of the invention.

FIG. 5 illustrates a method, independent of structure, of applying a software-implemented compliance transfer function to a signal according to one embodiment of the invention. A real-time signal, meaning a signal from a device (e.g., transmitter), is received and stored 501. This received and stored signal is modified according to a software-implemented transfer function 502. In one embodiment, the transfer function defines a protocol-compliant signal at a receiver. Both the stored signal and the modified signal may be simultaneously shown to a user on a display device, such as an oscilloscope.

The modified signal is analyzed 503 to determine whether the modified signal is compliant with a particular specification or specifications. If the modified signal is within the specification(s), then the process is complete 505 and the transmitter device is not adjusted. If the modified signal is not within the specifications(s), then the settings of the transmitter device are adjusted 504 and the method is performed again. One skilled in the art will recognize that various techniques may be used to adjust the transmitter device settings during this process.

The invention may be integrated into an oscilloscope or computer system. Various displays may also be used in connection with the invention and may present both the zero-link signal from the transmitter device and the modified transfer-link signal to a user. The invention may also be built as a stand-alone device with a capturing device.

The foregoing description of the invention has been described for purposes of clarity and understanding. It is not intended to limit the invention to the precise form disclosed. Various modifications may be possible within the scope and equivalence of the appended claims.

What is claimed is:

1. A signal modeling apparatus for analyzing operation of a transmitting device comprising:
an input coupled to receive a captured real-time signal of a real-time signal outputted by said transmitting device;
a signal modification module that applies a transmitter compliant transfer function, wherein includes specifications describing both transmitter characteristics of the transmitting device and signal quality at a receiver, to said captured real-time signal to create a modified signal, said transmitter compliant transfer function being a transfer function defined by at least one protocol specification that characterizes modifications to a signal that passes through a communications medium that complies with said at least one protocol specification, said modified signal being a model of said real-time signal as received at the receiver device after passing through said communications medium that complies with said at least one protocol specification, said signal modification module being implemented in computer readable instruction code operating on a device capable of running said computer readable instruction code; and
an output coupled to transmit said modified signal to a display device in order to permit analysis of said transmitting device operation relative to said at least one protocol specification.

2. The signal modeling apparatus of claim 1 further comprising a transfer function module, coupled to said signal modification module, that stores at least one transfer function to apply to said captured real-time signal.

3. The signal modeling apparatus of claim 2 wherein said transfer function module provides an interface that allows a user to select a transfer function to be applied to said captured real-time signal.

4. The signal modeling apparatus of claim 2 wherein said transfer function module provides a plurality of transfer functions corresponding to a plurality of protocol specifications to said signal modification module such that said signal modification module creates a plurality of modified signals corresponding to said plurality of transfer functions in order to permit analysis of said transmitting device operation relative to said plurality of protocol specifications.

5. The signal modeling apparatus of claim 1 further comprising a signal analysis module, coupled to said signal modification module, to automatically analyze said modified signal.

6. The signal modeling apparatus of claim 5 wherein said signal analysis module provides feedback information used to adjust at least one setting on said transmitting device.

7. The signal modeling apparatus of claim 5 wherein said signal analysis module compares said modified signal to said at least one protocol specification.

8. The signal modeling apparatus of claim 7 wherein said signal analysis module adjusts at least one setting of said transmitting device in response to said comparison of said modified signal to said at least one protocol specification.

9. The signal modeling of claim 1 wherein said display device is an oscilloscope screen.

10. The signal modeling of claim 9 wherein said signal modification module is integrated within an oscilloscope operating as said device capable of running said computer readable instruction code.

11. The signal modeling of claim 1 wherein said display device is a computer screen.

12. The signal modeling of claim 11 wherein said signal modification module is integrated within a computer device operating as said device capable of running said computer readable instruction code.

13. A computerized method operating according to computer readable instruction code on a device capable of running said computer readable instruction code for modeling a signal in order to analyze operation of a transmitting device comprising:
receiving a captured real-time signal of a real-time signal outputted by said transmitting device;
applying a transmitter compliant transfer function, wherein includes specifications describing both transmitter characteristics of the transmitting device and signal quality at a receiver, that modifies at least one characteristic of said captured real-time signal to create a modified signal, said transmitter compliant transfer function being a transfer function defined by at least one protocol specification that characterizes characterizing modifications to a signal that passes through a communications medium that complies with at said least one protocol specification, said modified signal being a model of said real-time signal as received at the receiver device after passing through said communications medium that complies with said at least one protocol specification; and
displaying said modified signal in order to permit analysis of said transmitting device operation relative to said at least one protocol specification.

14. The computerized method of claim 13 further comprising the step of comparing said modified signal to said at least one protocol specification to determine whether said modified signal is compliant with said at least one protocol specification.

15. The computerized method of claim 14 wherein said transmitter compliant transfer function is derived from said at least one protocol specification.

16. The computerized method of claim 14 further comprising the step of providing a feedback signal to said transmitting device in response to said comparison of said modified signal and said at least one protocol specification.

17. The computerized method of claim 16 wherein said feedback signal adjusts at least one setting of said transmitting device.

18. The computerized method of claim 13 wherein said modified signal is displayed on an oscilloscope.

19. A computer program product embodied on a non-transitory computer readable medium, said computer program product containing computer instructions that perform processes to model a signal in order to analyze operation of a transmitting device, said processes comprising:
receiving a captured real-time signal of a real-time signal outputted by said transmitting device;
applying a transmitter compliant transfer function, wherein includes specifications describing both transmitter characteristics of the transmitting device and signal quality at a receiver, that modifies at least one characteristic of said the captured real-time signal to create a modified signal, said transmitter compliant transfer function being a transfer function defined by at least one protocol specification that characterizes characterizing modifications to a signal that passes through a communications medium that complies with said at least one protocol specification, said modified signal being a model of said real-time signal as received at a receiver device after passing through said communications medium that complies with said at least one protocol specification; and
displaying said modified signal in order to permit analysis of said transmitting device operation relative to said at least one protocol specification.

20. The computer program product of claim 19 further comprising computer instructions for comparing said modified signal to at said at least one protocol specification to determine whether said modified signal is compliant with said at least one protocol specification.

21. The computer program product of claim 20 further comprising computer instructions for providing a feedback signal to said transmitting device in response to said comparison of said modified signal and said at least one protocol specification.

22. The computer program product of claim 21 wherein said feedback signal adjusts at least one setting of said transmitting device.

23. The computer program product of claim 21 wherein said computer instructions are located within an oscilloscope operating as said device capable of running said computer readable instruction code.

* * * * *